United States Patent
Kang

(10) Patent No.: US 9,368,217 B2
(45) Date of Patent: Jun. 14, 2016

(54) VOLTAGE GENERATOR, INTEGRATED CIRCUIT, AND VOLTAGE GENERATING METHOD

(71) Applicant: SK hynix Inc., Icheon-si Gyeonggi-do (KR)

(72) Inventor: In Ho Kang, Yongin-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 102 days.

(21) Appl. No.: 14/166,947

(22) Filed: Jan. 29, 2014

(65) Prior Publication Data

US 2015/0102857 A1 Apr. 16, 2015

(30) Foreign Application Priority Data

Oct. 10, 2013 (KR) .......................... 10-2013-0120768

(51) Int. Cl.
*G05F 1/10* (2006.01)
*G11C 16/12* (2006.01)
*H02M 3/07* (2006.01)
*G11C 5/14* (2006.01)
*G11C 16/30* (2006.01)

(52) U.S. Cl.
CPC ................ *G11C 16/12* (2013.01); *G11C 5/145* (2013.01); *G11C 16/30* (2013.01); *H02M 3/07* (2013.01)

(58) Field of Classification Search
None
See application file for complete search history.

(56) References Cited

U.S. PATENT DOCUMENTS

| 5,337,284 | A * | 8/1994 | Cordoba et al. | 365/227 |
| 6,275,099 | B1 * | 8/2001 | Ghilardelli | 327/540 |
| 6,414,535 | B1 * | 7/2002 | Ooishi | 327/538 |
| 8,797,088 | B2 * | 8/2014 | Chan | 327/536 |
| 8,854,119 | B2 * | 10/2014 | Jiang et al. | 327/536 |
| 2005/0264347 | A1 * | 12/2005 | Gyohten et al. | 327/540 |
| 2007/0025152 | A1 | 2/2007 | Futatsuyama | |
| 2008/0136472 | A1 * | 6/2008 | Shor | 327/156 |
| 2011/0089999 | A1 * | 4/2011 | Jurasek | 327/540 |
| 2013/0120056 | A1 * | 5/2013 | Rountree | 327/540 |
| 2015/0102857 | A1 * | 4/2015 | Kang | 327/540 |

FOREIGN PATENT DOCUMENTS

| KR | 1020070036045 A | 4/2007 |
| KR | 1020130064374 A | 6/2013 |

* cited by examiner

*Primary Examiner* — Lincoln Donovan
*Assistant Examiner* — Khareem E Almo
(74) *Attorney, Agent, or Firm* — William Park & Associates Ltd.

(57) ABSTRACT

A voltage generator includes: a first pump configured to generate and output a first voltage to a first node in response to a first clock signal; a second pump configured to generate and output a second voltage to a second node in response to the first clock signal; a third pump configured to generate and output a third voltage to the first and second nodes in response to the first clock signal; a first switch configured to deliver the third voltage to the first node in response to a first control signal; and a second switch configured to deliver the third voltage to the second node in response to a second control signal, in which the first pump has a first drivability, the second pump has a second drivability, and the third pump has a third drivability greater than the first and second drivabilities.

20 Claims, 6 Drawing Sheets

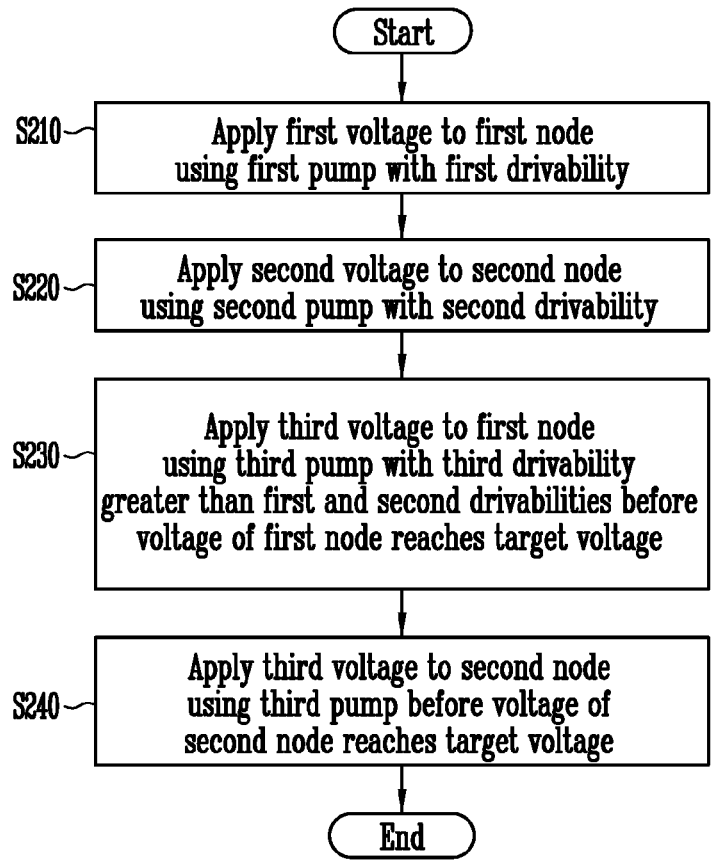
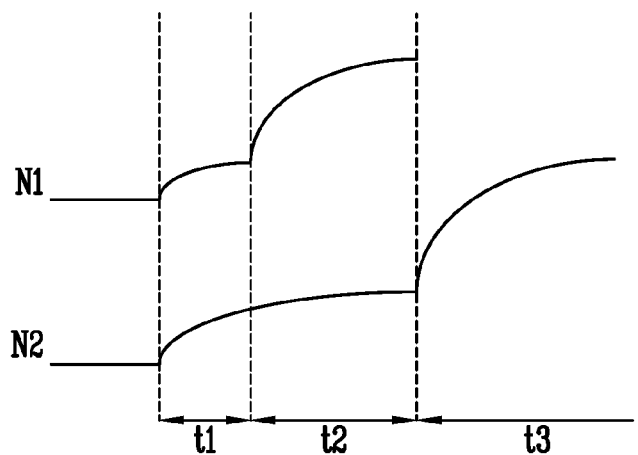

VOLTAGE GENERATOR, INTEGRATED CIRCUIT, AND VOLTAGE GENERATING METHOD

CROSS-REFERENCE TO RELATED APPLICATION

The present application claims priority to Korean patent application number 10-2013-0120768 filed on Oct. 10, 2013, in the Korean Intellectual Property Office, the entire disclosure of which is incorporated by reference herein.

BACKGROUND

1. Technical Field

The invention relates to electronic equipment. More specifically, the invention relates to a voltage generator, an integrated circuit, and a voltage generating method.

2. Related Art

Semiconductor memory devices are largely divided into volatile memory devices and nonvolatile memory devices.

Volatile memory devices have fast read and write speeds, but lose stored data when power supply is interrupted. Nonvolatile memory devices have relatively slow read and write speeds, but maintain stored data even when power supply is interrupted. Accordingly, in order to store data to be maintained irrespective of a state of power supply, a non-volatile memory device is used. Examples of non-volatile memory devices include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and so on. Flash memories are generally divided into a NOR type and a NAND type.

A flash memory has both the advantages of a RAM, that is, free programming and erasure of data, and the advantage of a ROM, that is, preservation of stored data even when power supply is interrupted. Flash memories are widely used as storage media of portable electronic equipment, such as digital cameras, personal digital assistants (PDAs), and MP3 players.

Recently, there has been an increasing demand to improve a degree of integration of a memory.

A semiconductor memory device desirably has a small chip size.

SUMMARY

The invention is directed to a voltage generator, an integrated circuit, and a voltage generating method, which can reduce a chip size and current consumption.

One aspect of the present invention provides a voltage generator including: a first pump configured to generate and output a first voltage to a first node in response to a first clock signal; a second pump configured to generate and output a second voltage to second node in response to the first clock signal; a third pump configured to generate and output a third voltage to the first and second nodes in response to the first clock signal; a first switch configured to deliver the third voltage to the first node in response to a first control signal; and a second switch configured to deliver the third voltage to the second node in response to a second control signal, in which the first pump has a first drivability, the second pump has a second drivability, and the third pump has a third drivability greater than the first and second drivabilities.

Another aspect of the present invention provides an integrated circuit including: a voltage generator configured to supply an operating voltage to a peripheral circuit, in which the voltage generator includes: a first pump configured to generate and output a first voltage to a first node in response to a first clock signal; a second pump configured to generate and output a second voltage to a second node in response to the first clock signal; a third pump configured to generate and output a third voltage to the first and second nodes in response to the first clock signal; a first switch configured to deliver the third voltage to the first node in response to a first control signal; and a second switch configured to deliver the third voltage to the second node in response to a second control signal, in which the first pump has a first drivability, the second pump has a second drivability, and the third pump has a third drivability greater than the first and second drivabilities.

Still another aspect of the present invention provides a voltage generating method including: applying a first voltage to a first node using a first pump with a first drivability; applying a second voltage to a second node using a second pump with a second drivability; applying a third voltage to the first node and the second node using a third pump with a third drivability greater than the first and second drivabilities before a voltage of the first node and a voltage of the second node reaches a target voltage.

In an embodiment of the present invention, a memory system comprises: a non-volatile memory device; a memory controller coupled to the non-volatile memory device, wherein the non-volatile memory device includes: a first pump configured to generate and output a first voltage to a first node in response to a first clock signal; a second pump configured to generate and output a second voltage to a second node in response to the first clock signal; a third pump configured to generate and output a third voltage to the first and second nodes in response to the first clock signal; a first switch configured to deliver the third voltage to the first node in response to the first control signal; and a second switch configured to deliver the third voltage to the second node in response to a second control signal, wherein the first pump has a first drivability, the second pump has a second drivability, and the third pump has a third drivability greater than the first and second drivabilities.

BRIEF DESCRIPTION OF THE DRAWINGS

The above and other features and advantages of the present invention will become more apparent to those of ordinary skill in the art by describing in detail various embodiments thereof with reference to the attached drawings in which:

FIG. 6 is a flowchart illustrating a voltage generating method according to an embodiment of the present invention;

FIG. 7 is a waveform chart illustrating the voltage generating method shown in FIG. 6;

DETAILED DESCRIPTION

Hereinafter, various embodiments of the present invention will be described in detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
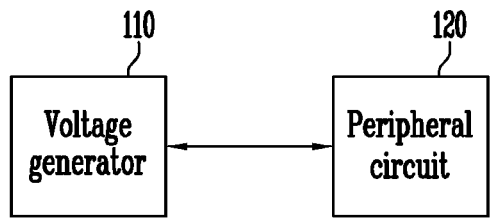
FIG. 1 is a block diagram illustrating an integrated circuit according to an embodiment of the present invention.

FIG. 1 is a block diagram illustrating an integrated circuit according to an embodiment of the present invention.

Referring to FIG. 1, an integrated circuit 100 according to an embodiment of the present invention includes a voltage generator 110 and a peripheral circuit 120.

The voltage generator 110 supplies an operating voltage to the peripheral circuit 120.

Figure 2:
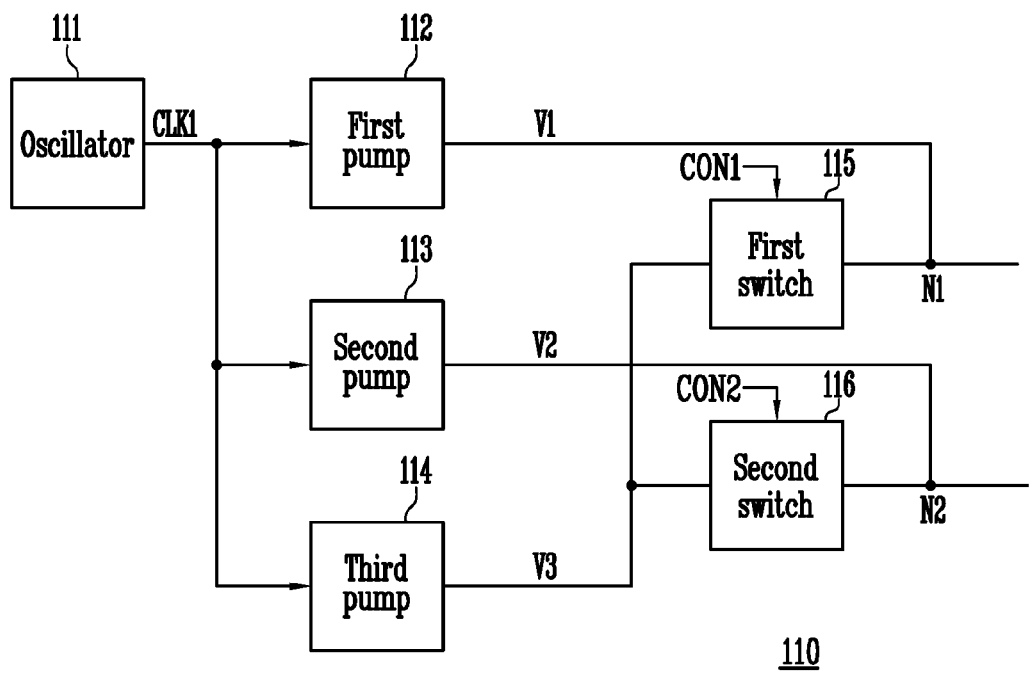
FIG. 2 is a block diagram illustrating a voltage generator shown in FIG. 1.

FIG. 2 is a block diagram illustrating a voltage generator shown in FIG. 1.

Referring to FIG. 2, the voltage generator 110 includes an oscillator 111, a first pump 112, a second pump 113, a third pump 114, a first switch 115, and a second switch 116.

The oscillator 111 generates a first clock signal CLK1.

The first pump 112 generates a first voltage V1 in response to the first clock signal CLK1. The first pump 112 outputs the generated first voltage V1 to a first node N1.

The second pump 113 generates a second voltage V2 in response to the first clock signal CLK1. The second pump 113 outputs the generated second voltage V2 to a second node N2.

The third pump 114 generates a third voltage V3 in response to the first clock signal CLK1. The third pump 114 outputs the generated third voltage V3 to the first node N1 and the second node N2.

The first switch 115 is configured to deliver the voltage V3 to the first node N1 in response to a first control signal CON1.

The second switch 116 is configured to deliver the voltage V3 to the second node N2 in response to a second control signal CON2.

The first pump 112 has a first drivability, the second pump 113 has a second drivability, and the third pump 114 has a third drivability that is greater than the first and second drivabilities.

The first control signal CON1 is input at a first timing, and the second signal CON2 is input at a second timing.

Accordingly, it is possible to quickly increase an electric potential of the first node N1 by applying a voltage to the first node N1 using the first pump 112 having a smaller drivability and the third pump 114 having a greater drivability. It is also possible to quickly increase an electric potential of the second node N2 by applying a voltage to the second node N2 using the second pump 113 having a smaller drivability and the third pump 114 having a greater drivability. Since the third pump 114 operates only at a timing at which the greater drivability is needed, an operating current of the voltage generator 110 may be reduced. Inclusion of both the first and second pumps 112 and 113 having a small drivability and the third pump 114 having a great drivability may lead to a reduced chip size.

Figure 3:
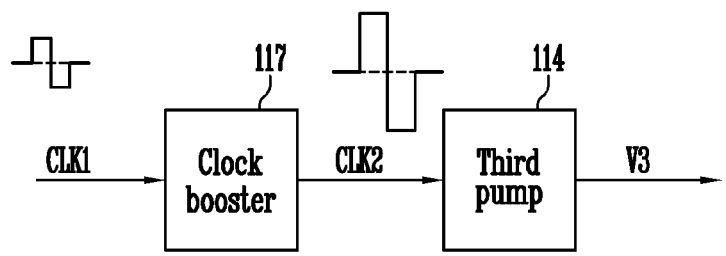
FIGS. 3 and 4 are block diagrams illustrating a detailed configuration of the voltage generator shown in FIG. 2.
Figure 4:
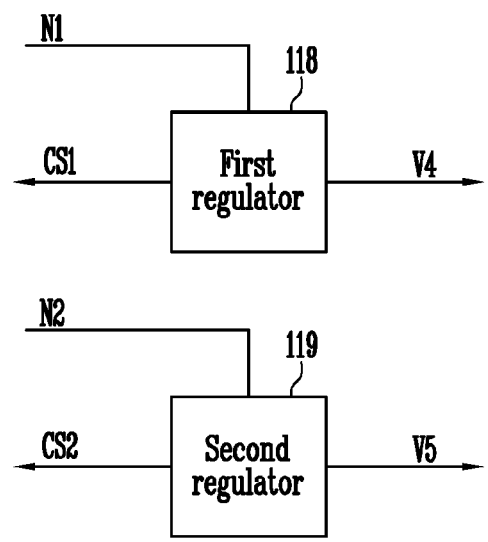

FIGS. 3 and 4 are block diagrams illustrating a detailed configuration of the voltage generator shown in FIG. 2.

Referring to FIG. 3, the voltage generator 110 further includes a clock booster.

The clock booster 117 generates the second clock signal CLK2 having an increased amplitude in response to the first clock signal CLK1.

The third pump 114 may generate the third voltage V3 in response to the second clock signal CLK2.

The number of capacitors included in the third pump 114 may be reduced by allowing the third pump 114 to generate the third voltage V3 using the clock booster 117 when a larger drivability is needed. Thus, the pump size may be reduced and the chip size may be further reduced.

Referring to FIG. 4, the voltage generator 110 further includes a first regulator 118 and a second regulator 119.

The first regulator 118 outputs a signal CS1 for controlling input of the first clock signal to the first pump based on the electric potential of the first node N1. The first regulator 118 outputs a fourth voltage V4 as a target voltage.

The second regulator 119 outputs a signal CS2 for controlling input of the first clock signal to the second pump based on the electric potential of the second node N2. The second regulator 119 outputs a fifth voltage V5 as a target voltage.

When the voltage generator supplies an operating voltage to a semiconductor memory device, the fourth voltage V4 may be a pass voltage, and the fifth voltage V5 may be a program voltage. The first timing is before pass voltage is generated and the second timing is before the program voltage is generated. This will be described below in detail.

The voltage generator may apply a voltage to the first node N1 using the first pump having a smaller drivability and the third pump having a larger drivability, before generating the fourth voltage V4, thereby quickly increasing the electric potential of the first node N1. The voltage generator may also apply a voltage to the second node N2 using the second pump having a smaller drivability and the third pump having a larger drivability, before generating the fifth voltage V5, thereby quickly increasing the electric potential of the second node N2.

Figure 5:
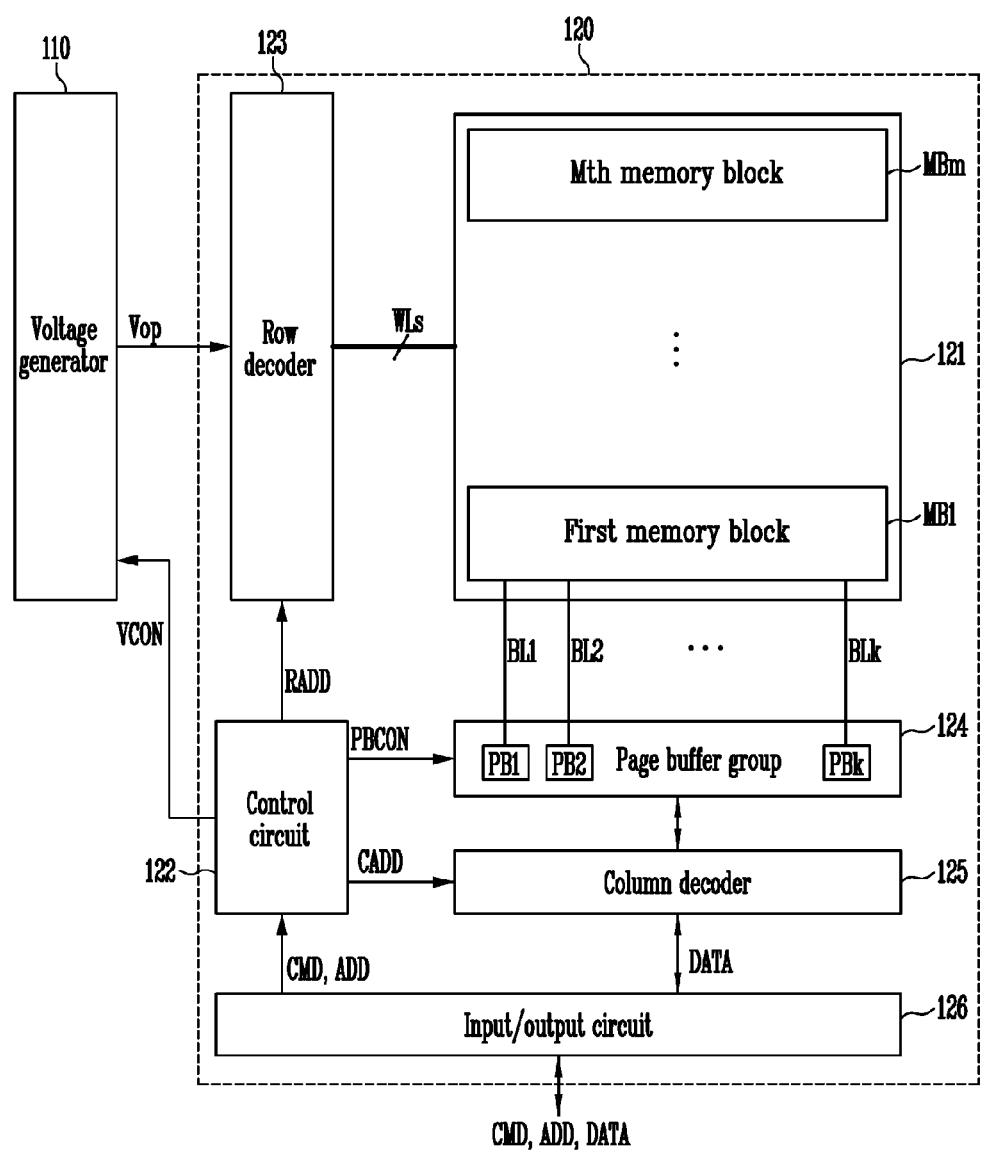
FIG. 5 is a block diagram illustrating a peripheral circuit shown in FIG. 1.

FIG. 5 is a block diagram illustrating a peripheral circuit shown in FIG. 1.

FIG. 5 will exemplify a case in which the peripheral circuit is a semiconductor memory device.

Referring to FIG. 5, the peripheral circuit 120 includes a memory array 121 including first to mth memory blocks MB1 to MBm, a control circuit 122 configured to perform an operation of programming, reading, or erasing memory cells included in a selected page of each of memory blocks MB1 to MBm, a row decoder 123, a page buffer group 124, a column decoder 125, and an input/output circuit 126.

The memory cells included in the memory block may be divided in physical page units or logical page units. For example, memory cells coupled to one word line constitute one physical page. This page is a basic unit of a program operation or a read operation.

The control circuit 122 outputs a voltage control signal VCON for generating a voltage needed to perform a program operation, a verify operation, a read operation, or an erase operation to the voltage generator 110 in response to a command signal CMD input through the input/output circuit 126 from the outside, and outputs a PB control signal PBCON for controlling page buffers PB1 to PBk included in the page buffer group 124, depending on the kind of operation. In addition, the control circuit 122 outputs a row address signal RADD and a column address signal CADD in response to an address signal ADD input through the input/output circuit 126 from the outside.

The row decoder 123 may allow operating voltages Vop output by the voltage generator 110 to be delivered to local lines of a memory block selected in the memory array 121, in response to row address signals RADD of the control circuit 122. Thus, a program voltage or a read voltage is applied to a local word line coupled with a selected cell. A pass voltage is applied to local word lines coupled WLs with unselected cells. During an erase operation, an erase voltage may be applied to all memory cells in a block. Thus, data is stored in the selected cell by a program voltage, and the data stored in the selected cell is read by a read voltage.

The page buffer group 124 includes a plurality of page buffers PB1 to PBk coupled with the memory array 121 through bit lines BL1 to BLk. The page buffers PB1 to PBk of the page buffer group 124 selectively pre-charge the bit lines BL1 to BLk according to data input to store data in the memory cells or sense voltages of the bit lines BL1 to BLk to read the data from the memory cells, in response to the PB control signal PBCON of the control circuit 122.

The column decoder 125 selects the page buffers PB1 to PBk included in the page buffer group 124 in response to the column address signal CADD output by the control circuit 122. That is, the column decoder 125 sequentially delivers data DATA to be stored in the memory cells to the page buffers PB1 to PBk in response to the column address signal CADD. In addition, the column decoder 125 sequentially selects the page buffers PB1 to PBk in response to the column address signal CADD, such that data of the memory cells latched in the page buffers PB1 to PBk may be output to the outside by a read operation.

The input/output circuit 126 delivers data DATA to the column decoder 125 according to control of the control circuit 122 in order to input data that is input from the outside and then stored in the memory cells during a program operation to the page buffer group 124. When the column decoder 125 delivers data delivered from the input/output circuit 126 to the page buffers PB1 to PBk of the page buffer group 124 according to the above-described method, the page buffers PB1 to PBk store the input data in an internal latch circuit. In addition, during a read operation, the input/output circuit 126 outputs data DATA delivered through the column decoder 125 from the page buffers PB1 to PBk of the page buffer group 124 to the outside.

In the voltage generator of the related art, each pump for generating an operating voltage has a great drivability. Accordingly, this leads to a problem of increase in the size of the voltage generator and thus the size of the chip. This also leads to another problem of increase in current consumption because the pump still has a great drivability even when an output voltage of the voltage generator reaches a target voltage and only the voltage level of the target voltage need be maintained.

The voltage generator 110 according to an embodiment of the present invention may quickly generate a pass voltage using the first pump having a small drivability and the third pump having a great drivability. In addition, the voltage generator 110 may quickly generate a program voltage using the second pump having a small drivability and the third pump having a great drivability. Since the third pump operates only at a timing at which the greater drivability is needed, an operating current of the voltage generator 110 may be reduced. Inclusion of both the first and second pumps having a small drivability and the third pump having a great drivability may lead to a reduced chip size.

FIG. 6 is a flowchart illustrating a voltage generating method according to an embodiment of the present invention. FIG. 7 is a waveform chart illustrating the voltage generating method shown in FIG. 6.

Referring to FIGS. 6 and 7, in timing t1, the method includes applying a first voltage to a first node N1 using a first pump having a first drivability in operation S210, and applying a second voltage to a second node N2 using a second pump having a second drivability in operation S220. The first and second pumps apply the first and second voltages to the first and second nodes N1 and N2 in response to the first clock signal CLK1 (shown in the prior figures).

In timing t2, the method includes applying a third voltage to the first node N1 using a third pump having a third drivability greater than the first and second drivabilities before the voltage of the first node N1 reaches a target voltage in operation S230. That is, in timing t2, the voltage is applied to the first node N1 using the first pump and the third pump. When the third voltage is applied to the first node N1 using the third pump, the third voltage is not applied to the second node N2.

In timing t3, the method includes applying a third voltage to the second node N2 using a third pump having a third drivability greater than the first and second drivabilities before the voltage of the second node N2 reaches a target voltage in operation S240. That is, in timing t3, the voltage is applied to the second node N2 using the second pump and the third pump. When the third voltage is applied to the second node N2 using the third pump, the third voltage is not applied to the first node N1. In addition, the third pump applies the third voltage to the first node N1 or second node N2 in response to a second clock signal CLK2 (shown in prior figures) having a greater amplitude than the first clock signal CLK1 (shown in prior figures).

As illustrated in FIG. 5, when the voltage generator supplies an operating voltage to a semiconductor memory device, the target voltage of the first node N1 is a pass voltage, and the target voltage of the second node N2 is a program voltage.

Accordingly, in the voltage generating method according to an embodiment of the present invention, a pass voltage may be quickly generated using the first pump having a small drivability and the third pump having a great drivability. In addition, in the voltage generating method, a program voltage may be quickly generated using the second pump having a small drivability and the third pump having a great drivability. Since the third pump operates only at a timing at which the greater drivability is needed, an operating current of the voltage generator may be reduced. Inclusion of both the first and second pumps having a small drivability and the third pump having a great drivability may lead to a reduced chip size.

Figure 8:
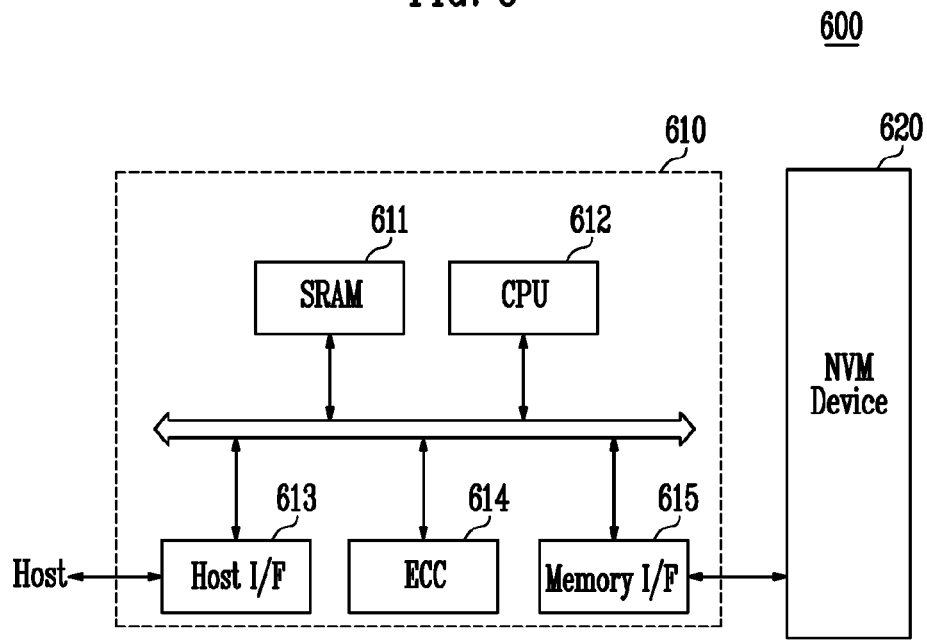
FIG. 8 is a block diagram simply showing a memory system according to an embodiment of the present invention.

FIG. 8 is a block diagram simply showing a memory system according to an embodiment of the present invention.

Referring to FIG. 8, a memory system 600 according to an embodiment of the present invention includes a non-volatile memory device 620 and a memory controller 610.

The non-volatile memory device 620 may be configured to include the above-described semiconductor memory device for compatibility with the memory controller 610 and operated in the above-described method. The memory controller 610 may be configured to control the non-volatile memory device 620. A memory card or solid-state disk (SSD) may be provided as a combination of the non-volatile memory device 620 and the memory controller 610. The SRAM 611 may be used as an operating memory of a processing unit 612. The memory interface 613 includes a data exchange protocol of a host that is coupled with the memory system 600. An error correction block 614 detects and corrects an error included in data read from the non-volatile memory device 620. The memory interface 615 interfaces with the non-volatile memory device 620 of the invention. The processing unit 612 performs all control operations for data exchange by the memory controller 610.

Although not shown, it would be obvious to those skilled in the art that the memory system 600 according to the invention may further include a ROM (not shown) that stores code data for interfacing with a host. The non-volatile memory device 620 may be provided as a multi-chip package including a plurality of flash memory chips. The memory system 600 of the invention may be a storage medium with high reliability that has low error probability. In particular, the flash memory device of the invention may be included in a memory system such as a solid-state disk (SSD) which has been actively studied recently. In this case, the memory controller 610 is configured to communicate with the outside (e.g., a host) through one of various interface protocols such as USB, MMC, PCI-E, SATA, PATA, SCSI, ESDI, and IDE.

Figure 9:
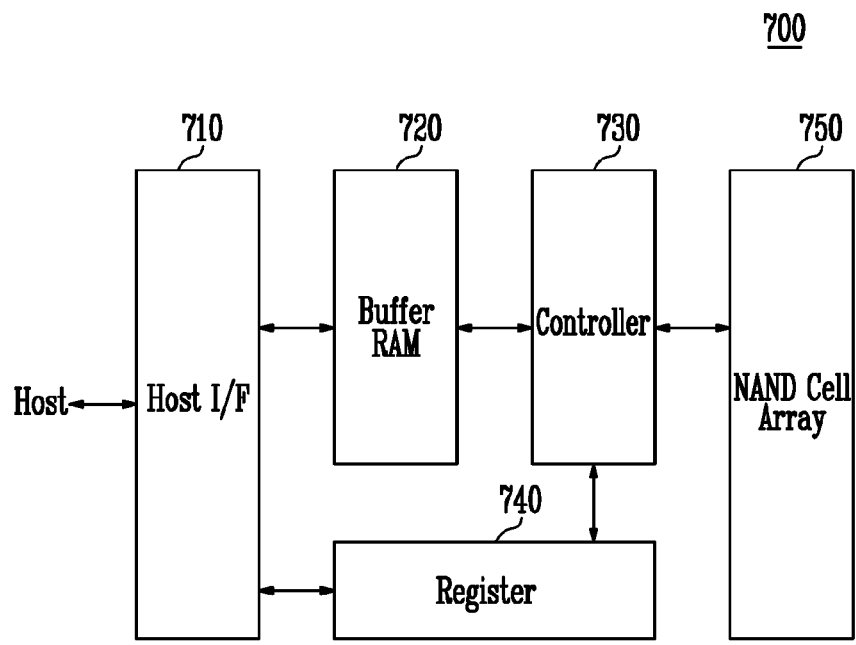
FIG. 9 is a block diagram simply showing a fusion memory device or fusion memory system for performing program operations according to the above-described various embodiments.

FIG. 9 is a block diagram simply showing a fusion memory device or fusion memory system for performing program operations according to the various embodiments described above. For example, the technical feature of the invention may be applied to a OneNAND flash memory device 700 as a fusion memory device.

The OneNAND memory device 700 includes a host interface 710 for exchanging all kinds of information with a device using a different protocol, a buffer RAM 720 for embedding a code for driving a memory device, a control unit 730 for controlling all states such as a read state and a program state in response to a control signal and a command provided from the outside, a register 740 for storing data such as a command, an address, and a configuration of a system operating environment inside the memory device, and a NAND flash cell array 750 configured to include an operating circuit including a non-volatile memory cell and a page buffer. The OneNAND flash memory device programs data according to the above-described method in response to a write request of the host.

Figure 10:
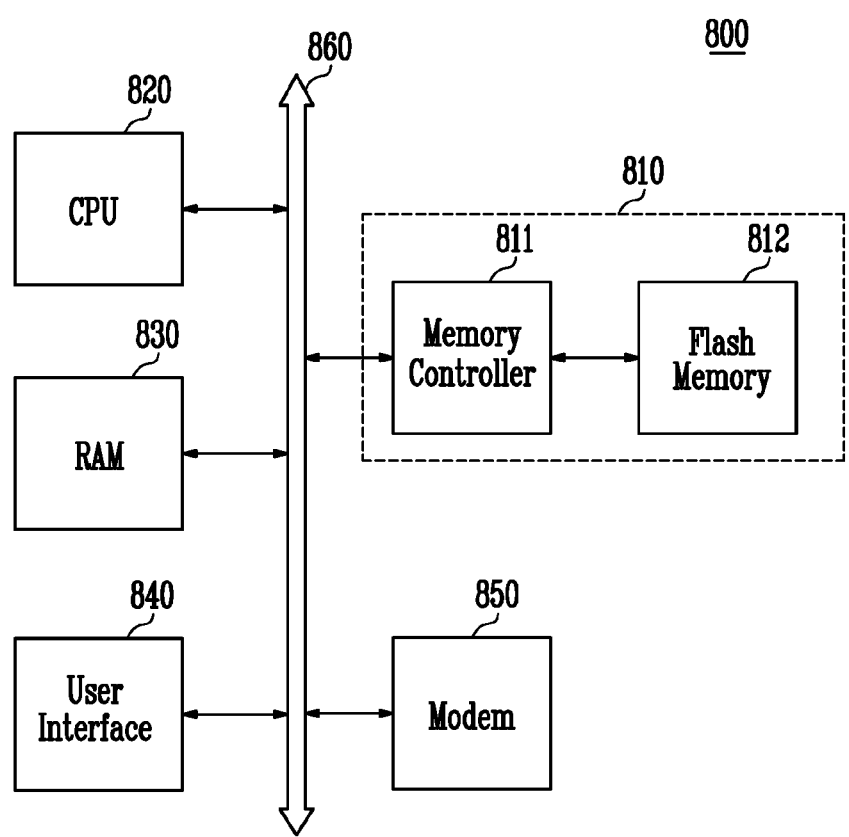
FIG. 10 is a block diagram simply showing a computing system including a flash memory device according to an embodiment of the present invention.

FIG. 10 is a block diagram simply showing a computing system including a flash memory device 812 according to the invention.

A computing system 800 according to the invention includes a microprocessor 820, a RAM 830, a user interface 840, a modem 850 such as a baseband chipset, and a memory system 810, which are electrically coupled to a system bus 860. If the computing system 800 according to the invention is a mobile device, a battery (not shown) may be further provided to supply an operating voltage of the computing system 800. Although not shown, it would be obvious to those skilled in the art that the computing system 800 according to the invention may further include an application chipset, a camera image processor (CIS), a mobile DRAM, etc. For example, the memory system 810 may be included in a solid state drive/disk (SSD) that uses the non-volatile memory to store data. Alternatively, the memory system 810 may be provided as a fusion flash memory 812 (for example, a OneNAND flash memory) with a memory controller 811.

The voltage generator according to an embodiment of the present invention may quickly generate a target voltage using the first pump having a small drivability and the third pump having a great drivability at the first timing. In addition, the voltage generator may quickly generate a target voltage using the second pump having a small drivability and the third pump having a great drivability at the second timing. Since the third pump operates only at a timing at which the greater drivability is needed, an operating current of the voltage generator may be reduced. Inclusion of both the first and second pumps having a small drivability and the third pump having a great drivability may lead to a reduced chip size.

The various embodiments of the present invention are not implemented only by a device and/or method, but can be implemented through a program for realizing functions corresponding to the configurations of the various embodiments of the present invention and a recording medium having the program recorded thereon. Such implementation can be easily made by a skilled person in the art to which the invention pertains from the above description of the various embodiments.

While this invention has been described in connection with what are presently considered to be practical various embodiments, it is to be understood that the invention is not limited to the disclosed embodiments, but on the contrary is intended to cover various modifications and equivalent arrangements included within the spirit and scope of the appended claims.

What is claimed is:

1. A voltage generator comprising:
   a first pump configured to generate and output a first voltage to a first node in response to a first clock signal;
   a second pump configured to generate and output a second voltage to a second node in response to the first clock signal; and
   a third pump configured to generate and output a third voltage to a first switch and a second switch in response to the first clock signal, respectively,
   wherein the first switch configured to deliver the third voltage directly to the first node in response to a first control signal,
   the second switch configured to deliver the third voltage directly to the second node in response to a second control signal, and
   wherein the first pump has a first drivability, the second pump has a second drivability, and the third pump has a third drivability greater than the first and second drivabilities.

2. The voltage generator of claim 1, further comprising a clock booster configured to generate a second clock signal having an increased amplitude in response to the first clock signal,
   wherein the third pump generates the third voltage in response to the second clock signal.

3. The voltage generator of claim 1, further comprising:
   a first regulator configured to control input of the first clock signal to the first pump on the basis of an electric potential of the first node and output a fourth voltage; and
   a second regulator configured to control input of the first clock signal to the second pump on the basis of an electric potential of the second node and output a fifth voltage.

4. The voltage generator of claim 3, wherein the fourth voltage is a pass voltage, and the fifth voltage is a program voltage.

5. The voltage generator of claim 4, wherein the first control signal is input at a first timing, and the second control signal is input at a second timing.

6. The voltage generator of claim 5, wherein the first timing is before the pass voltage is generated, and the second timing is before the program voltage is generated.

7. An integrated circuit comprising:
   a voltage generator configured to supply an operating voltage to a peripheral circuit,
   wherein the voltage generator comprises:
   a first pump configured to generate and output a first voltage to a first node in response to a first clock signal;

a second pump configured to generate and output a second voltage to a second node in response to the first clock signal; and a third pump configured to generate and output a third voltage to a first switch and a second switch in response to the first clock signal, respectively, wherein the first switch configured to deliver the third voltage directly to the first node in response to a first control signal, the second switch configured to deliver the third voltage directly to the second node in response to a second control signal, and wherein the first pump has a first drivability, the second pump has a second drivability, and the third pump has a third drivability greater than the first and second drivabilities.

8. The integrated circuit of claim 7, wherein the voltage generator further comprises a clock booster configured to generate a second clock signal having an increased amplitude in response to the first clock signal, and the third pump generates the third voltage in response to the second clock signal.

9. The integrated circuit of claim 7, wherein the voltage generator further comprises:

a first regulator configured to control input of the first clock signal to the first pump on the basis of an electric potential of the first node and output a fourth voltage; and a second regulator configured to control input of the first clock signal to the second pump on the basis of an electric potential of the second node and output a fifth voltage.

10. The integrated circuit of claim 9, wherein the first control signal is input at a first timing, and the second control signal is input at a second timing.

11. The integrated circuit of claim 10, wherein the first timing is before the fourth voltage is generated, and the second timing is before the fifth voltage is generated.

12. A voltage generating method comprising:

applying a first voltage to a first node using a first pump with a first drivability;

applying a second voltage to a second node using a second pump with a second drivability;

applying a third voltage to the first node and the second node using a third pump with a third drivability greater than the first and second drivabilities before a voltage of the first node and a voltage of the second voltage reaches a target voltage.

13. The voltage generating method of claim 12, wherein the third voltage is not applied to the second node in the applying of the third voltage to the first node, and the third voltage is not applied to the first node in the applying of the third voltage to the second node.

14. The voltage generating method of claim 12, wherein the first and second pumps apply the first and second voltages to the first and second nodes in response to the first clock signal, and the third pump applies the third voltage to the first or second node in response to a second clock signal having a greater amplitude than the first clock signal.

15. The voltage generating method of claim 12, wherein the target voltage of the first node is a pass voltage and the target voltage of the second node is a program voltage.

16. The integrated circuit according to claim 8, wherein the third pump is configured to generated the third voltage using the clock booster.

17. The integrated circuit according to claim 7, wherein the third pump operates at a timing that is different from the first pump and second pump.

18. The integrated circuit according to claim 11, wherein the voltage generator is configured to apply a voltage to the second node before generating the fifth voltage.

19. The integrated circuit according to claim 7, wherein when the voltage generator supplies an operating voltage, a target voltage of the first node is a pass voltage, and a target voltage of the second node is a program voltage.

20. The integrated circuit according to claim 19, wherein the program voltage is generated using the second pump and third pump.

* * * * *